US 6,563,041 B2

(12) United States Patent
Sugawara et al.

(10) Patent No.: US 6,563,041 B2
(45) Date of Patent: May 13, 2003

(54) PHOTOELECTRIC CONVERSION DEVICE

(75) Inventors: Shin Sugawara, Yokaichi (JP); Takeshi Kyoda, Yokaichi (JP); Nobuyuki Kitahara, Yokaichi (JP); Hisao Arimune, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/996,537

(22) Filed: Nov. 27, 2001

(65) Prior Publication Data

US 2002/0117667 A1 Aug. 29, 2002

(30) Foreign Application Priority Data

Nov. 29, 2000 (JP) .......................... 2000-362020
Jan. 12, 2001 (JP) .......................... 2001-005428
Jan. 29, 2001 (JP) .......................... 2001-020624

(51) Int. Cl.$^7$ ................... H01L 31/052; H01L 31/0256; H01L 31/042
(52) U.S. Cl. ................ 136/250; 136/246; 136/256; 136/259; 136/261; 136/252; 257/432; 257/433; 257/436; 257/461; 257/443; 438/63
(58) Field of Search ................ 136/250, 246, 136/256, 259, 261, 252; 257/432, 433, 436, 461, 443; 438/63

(56) References Cited

U.S. PATENT DOCUMENTS

| 3,998,659 | A | * | 12/1976 | Wakefield | .................. 136/250 |
|---|---|---|---|---|---|
| 4,514,580 | A | | 4/1985 | Bartlett | .................. 136/250 |
| 4,614,835 | A | * | 9/1986 | Carson et al. | .................. 136/250 |
| 5,419,782 | A | * | 5/1995 | Levine et al. | .................. 136/246 |
| 6,281,427 | B1 | * | 8/2001 | Mitsuhiro et al. | .................. 136/250 |
| 6,417,442 | B1 | * | 7/2002 | Fukui et al. | .................. 136/250 |
| 6,437,234 | B1 | * | 8/2002 | Kyoda et al. | .................. 136/250 |
| 6,441,298 | B1 | * | 8/2002 | Thio | .................. 136/250 |
| 2002/0096206 | A1 | * | 7/2002 | Hamakawa et al. | .................. 136/244 |
| 2002/0162585 | A1 | * | 11/2002 | Sugawara et al. | .................. 136/250 |

FOREIGN PATENT DOCUMENTS

| JP | 2000-22184 A | * | 1/2000 |
| JP | 2000-022184 | | 1/2000 |
| JP | 2001-168369 A | * | 6/2001 |
| JP | 2001-339086 A | * | 12/2001 |
| JP | 2002-50780 A | * | 2/2002 |

* cited by examiner

*Primary Examiner*—Alan Diamond
(74) *Attorney, Agent, or Firm*—Hogan & Hartson, LLP

(57) ABSTRACT

This photoelectric conversion device comprises a lower electrode, numerous p-type crystalline semiconductor particles deposited thereon, an insulator formed among the crystalline semiconductor particles, and a n-type semiconductor layer formed on the side of the upper portions of the crystalline semiconductor particles. The insulator is formed of a translucent material, and the surface of the lower electrode has been subjected to roughening treatment. Roughening the surface of the lower electrode allows light incident on the surface of the lower electrode to be scattered and directed to the crystalline semiconductor particles so that the photoelectric conversion efficiency is improved.

10 Claims, 5 Drawing Sheets

FIG. 1
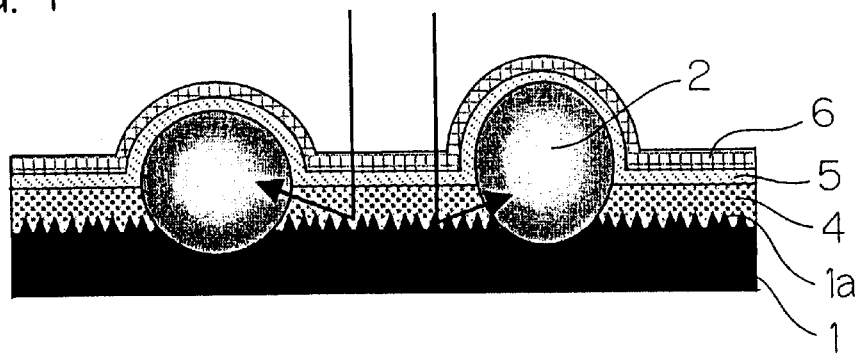
FIG. 2
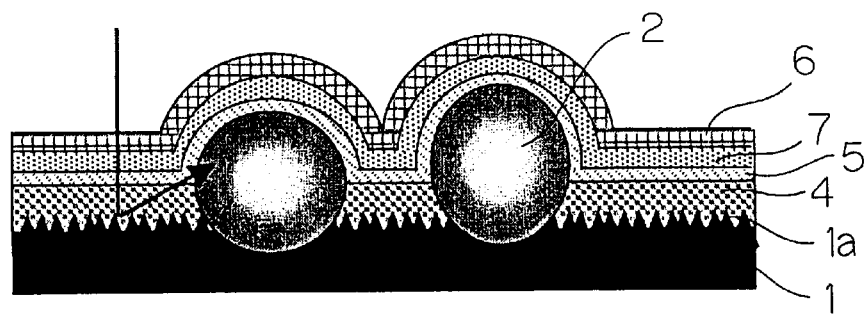
FIG. 3 COMPARATIVE EXAMPLE
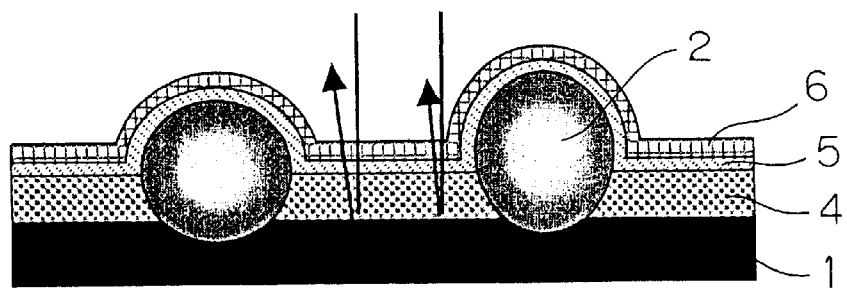

FIG. 7 COMPARATIVE EXAMPLE
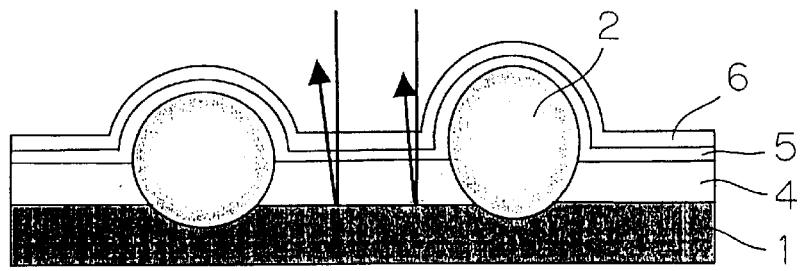
FIG. 8
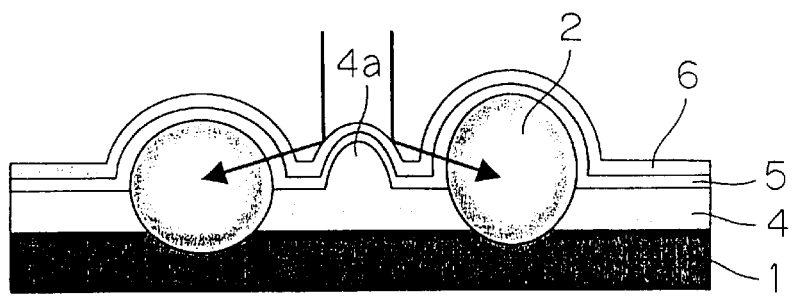
FIG. 9
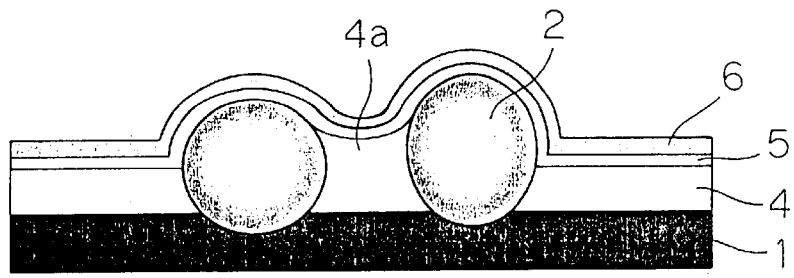

FIG. 10
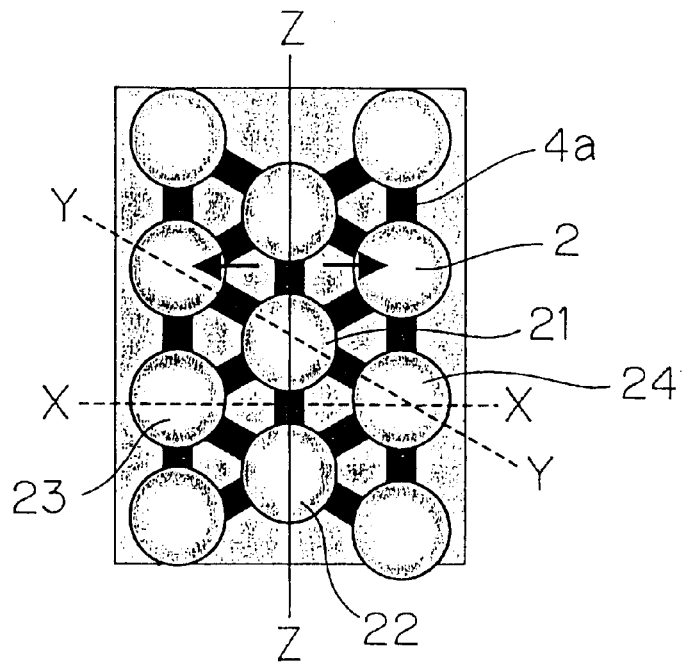
FIG. 11 COMPARATIVE EXAMPLE
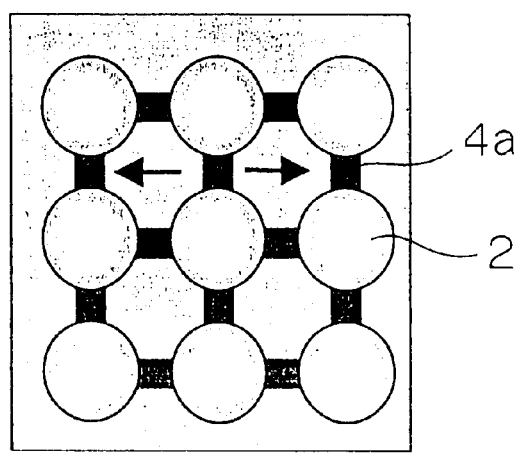

PHOTOELECTRIC CONVERSION DEVICE

This application is based on applications Nos. 2001-020624, 2000-362020, and 2001-005428 filed in Japan, the content of which is incorporated hereinto by reference.

BACKGROUND OF THE INVENTION

1. Field of the Invention

The present invention relates to a photoelectric conversion device. In particular, this invention relates to a photoelectric conversion device using numerous crystalline semiconductor particles.

2. Description of the Related Art

FIGS. 12–14 show photoelectric conversion devices using crystalline semiconductor particles that have been proposed so far.

FIG. 12 illustrates a solar cell in which a first conductive layer 33 is disposed over the surface of a substrate 32 which has been formed in a configuration with a periodically (regularly) indented pattern, and parts 31a of spherical or long cylindrical semiconductor crystals 31 are brought into electrical contact with the first conductive layer 33, while the other parts 31b of the spherical or long cylindrical semiconductor crystals 31 are brought into electrical contact with a second conductive layer 34. (Refer to Japanese Unexamined Patent Publication (Kokai) No. 2000-22184.) In FIG. 12, the numerals 35, 36, and 37 denote a high-reflection film, a spin-on-glass SOG1, and a spin-on-glass SOG2, respectively.

In the device shown in FIG. 12, since the spherical semiconductor crystals 31 are arranged according to the indented surface configuration of the substrate 32, it is necessary to form an insulator 37 (for example, spin-on-glass SOG2) along the indented contours of the substrate 32. Since such insulator formation cannot be performed by general printing methods, it has a problem of lowered productivity. In addition, since the device is arranged such that each of the recesses on the substrate 32 has one spherical semiconductor crystal 31 mounted thereon, mounting of the spherical semiconductor crystals 31 becomes difficult when they are reduced in size. It is therefore impossible in the above case to reduce the size of the spherical semiconductor crystals 31. Accordingly, reduction in quantity of the semiconductor used as the raw material cannot be accomplished, which causes the problem of low productivity and high cost.

FIG. 13 illustrates another known photoelectric conversion device (U.S. Pat. No. 5,419,782). In this photoelectric conversion device, apertures are formed in a first aluminum foil 44, and p-type silicon spheres 45 with n-type outer portions 46 are connected to the apertures. Then, the n-type outer portions 46 in the lower portions of the spheres are removed. An oxide coating 47 is applied to the surface of aluminum 48 and the oxide coating 47 in the lower portions of the spheres are removed so that the p-type silicon spheres 45 are joined to a second aluminum foil 48. A transparent coating 49 is provided at the top surface. In this device, due to the coating 49 having a configuration which abruptly changes at the lowest point, light incident on locations where the p-type silicon spheres 45 are absent is directed to the p-type silicon spheres 45, thereby improving the photoelectric conversion efficiency.

The photoelectric conversion device shown in FIG. 13 intends to improve the photoelectric conversion efficiency by the arrangement being such that the coating 49 has a configuration which abruptly changes at the lowest point so as to form a V-shape. However, since forming such a coating having a configuration that changes abruptly at the lowest point is technically difficult, it would cause poor productivity. In addition, the material of the coating 49 deteriorates when exposed to sunlight for long duration of time, gradually lowering the photoelectric conversion efficiency.

FIG. 14 illustrates a photoelectric conversion device in which an aluminum film 52 is formed around a steel substrate 51, and crushed silicon particles 54 are joined to the aluminum film 52, over which an insulator layer 53, n-type silicon portions 55 and a transparent conductive layer 56 are formed in succession (U.S. Pat. No. 4,514,580).

The disclosure of the photoelectric conversion device shown in FIG. 14 lacks detailed descriptions regarding preferred arrangements of the crystalline semiconductor particles 54 and preferred shapes of peripheral regions around the crystalline semiconductor particles 54. Accordingly, this device fails to efficiently utilize light incident on the peripheral regions around the crystalline semiconductor particles 54, causing the problem of low photoelectric conversion efficiency.

It is an object of the present invention to provide a photoelectric conversion device with high efficiency and high productivity.

BRIEF SUMMARY OF THE INVENTION (1) A photoelectric conversion device according to the present invention comprises: a lower electrode; numerous crystalline semiconductor particles of one conductivity type deposited on the lower electrode; an insulator formed among the crystalline semiconductor particles; and a semiconductor layer of the opposite conductivity type formed on the side of the upper portions of the crystalline semiconductor particles, wherein the insulator is formed of a translucent material, and the surface of the lower electrode comprises a roughened surface.

The above arrangement allows light that has been incident on the surface of the lower electrode to be scattered and directed to the crystalline semiconductor particles, thereby improving the photoelectric conversion efficiency, as well as it can enhance the adhesiveness between the lower electrode and the insulator formed thereon.

(2) Another photoelectric conversion device according to the present invention comprises: a lower electrode; numerous crystalline semiconductor particles of one conductivity type deposited on the lower electrode; an insulator formed among the crystalline semiconductor particles; and a semiconductor layer of the opposite conductivity type formed on the side of the upper portions of the crystalline semiconductor particles, wherein the insulator is formed of a translucent material, and a protruding portion comprising a reflective material is formed between the crystalline semiconductor particles.

The photoelectric conversion device according to the above arrangement allows incident light to be scattered by the protruding portion and directed to the crystalline semiconductor particles so that the photoelectric conversion efficiency is improved. Accordingly, a photoelectric conversion device with high efficiency and high productivity can be realized.

(3) Another photoelectric conversion device according to this invention comprises: a lower electrode; numerous crystalline semiconductor particles of one conductivity type deposited on the lower electrode; an insulator formed among the crystalline semiconductor particles; and a semiconductor layer of the opposite conductivity type formed on the side of the upper portions of the crystalline semiconductor particles, wherein the crystalline semiconductor particles are arranged such that a crystalline semiconductor particle is located on a straight line that perpendicularly crosses a line segment connecting central parts of other crystalline semiconductor particles that are adjacent to each other approximately at the midpoint of the line segment.

The photoelectric conversion device arranged as above enables light incident on peripheral regions around the crystalline semiconductor particles to contribute to the generation of electricity so that high photoelectric conversion efficiency can be achieved.

Structural details of these inventions are hereinafter described referring to the appended drawings.

BRIEF DESCRIPTION OF THE DRAWINGS

FIG. 1 is a cross-sectional view of a photoelectric conversion device according to a first embodiment of the present invention.

FIG. 2 is a cross-sectional view of another photoelectric conversion device according to the first embodiment of the present invention.

FIG. 3 is a cross-sectional view of a comparative example.

FIG. 7 is a cross-sectional view of a comparative example.

FIG. 8 is a cross-sectional view of a photoelectric conversion device according to a third embodiment of the present invention, which is a sectional view taken along the line X—X of FIG. 10.

FIG. 9 is a cross-sectional view of a photoelectric conversion device according to the third embodiment of the present invention, which is a sectional view taken along the line Y—Y of FIG. 10.

FIG. 10 is a plan view of the photoelectric conversion device according to the third embodiment of this invention.

FIG. 11 is a plan view showing a comparative example.

DETAILED DESCRIPTION OF THE INVENTION

Figure 4:
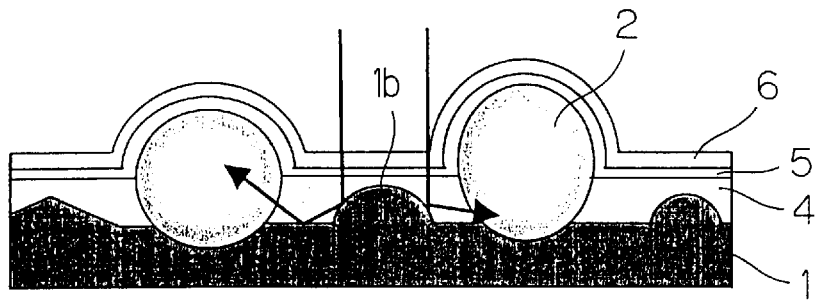
FIG. 4 is a cross-sectional view of a photoelectric conversion device according to a second embodiment of the present invention.

It is assumed in the following description that the crystalline semiconductor particles 2 are of p-type, and the semiconductor layer 5 formed over the crystalline semiconductor particles 2 is of n-type. However, the conductivity types may be reversed.

1. First Embodiment

FIG. 1 is a cross-sectional view of a photoelectric conversion device according to a first embodiment of the present invention.

In FIG. 1, the numerals 1, 2, 1*a*, 4, 5, 6 denote a lower electrode, p-type crystalline semiconductor particles, the surface of the lower electrode 1 that has been roughened, a translucent insulator layer, a n-type semiconductor layer, and a protective film, respectively.

The lower electrode 1 may be made of any material that has conductivity, for example, it may be made of a metal. The lower electrode 1 may also serve as substrate. When it is not to serve as substrate, it is possible to adopt a substrate made of an insulating material such as ceramics or resin so as to form the lower electrode 1 thereon.

The surface 1*a* of the lower electrode 1 is a roughened surface. By roughening the surface 1*a* of the lower electrode 1, light incident on the surface 1*a* of the lower electrode 1 is scattered and directed to the crystalline semiconductor particles 2 so that the photoelectric conversion efficiency is improved. In addition, the roughened surface has an effect to enhance the adhesiveness between the surface and the insulator layer 4 formed thereon.

There are various methods for roughening the surface 1*a* of the lower electrode 1 including a method in which aluminum paste containing a filler or glass frit is applied to the substrate and fired so as to form the lower electrode 1, sandblasting in which fine particles of alumina or the like are sprayed on the surface of the lower electrode 1 by means of pressured gas so as to physically grind the surface, the RIE method, etching by means of chemical solution, and so forth.

The arithmetic average roughness of the surface of the lower electrode 1 is preferably in the range of 0.01–10. When the arithmetic average roughness is below 0.01, the scattering of light is so insignificant that the effect is too small to enhance the photoelectric conversion efficiency, and the adhesiveness is also poor. When the arithmetic average roughness is over 10, it becomes hard to form the insulator layer over the lower electrode layer so that the insulator layer suffers great unevenness in thickness. In addition, such a large roughness may cause short circuit to occur, and is therefore unfavorable. The "arithmetic average roughness" is defined to be an average of |f(x)| which are sampled in some length or region of the lower electrode layer 1, where f(x) is a deviation ($\mu$m) of the surface height pattern from the average thereof (JIS B0601).

The material of the lower electrode 1 is preferably aluminum or an aluminum alloy. The lower electrode 1 can be realized with high reflectance, low resistance, high reliability and at a low cost by the use of aluminum or an aluminum alloy.

The p-type crystalline semiconductor particles 2 comprise Si, Ge, and a small amount of p-type impurity such as B, Al, and Ga added thereto. The shapes of the p-type crystalline semiconductor particle 2 may be polygons or shapes having curved surfaces. The particle sizes may be even or uneven. However, uneven particle sizes will be advantageous in view of cost because an additional process is required in order to uniformize the size of the semiconductor particles. Furthermore, having convex surfaces reduces the dependence on the incident angles of light rays.

An example of methods for arranging the crystalline semiconductor particles 2 is discussed below. Holes that are smaller than the particle diameters of the crystalline semiconductor particles 2 are formed and arranged in a box-shaped jig. The pressure inside the box-shaped jig is decreased by a pump so that the crystalline semiconductor particles 2 are sucked into the holes with sizes smaller than their particle diameters. Then, the jig is transferred onto the substrate 1, where the pressure inside the jig is increased so that the crystalline semiconductor particles 2 are disposed on the substrate 1. According to this arrangement method, it is possible to easily arrange the crystalline semiconductor particles 2 in a desired manner by designing the arrangement of the holes to be formed in the box-shaped jig. In addition, there is a method in which oscillation such as supersonic wave is applied so as to arrange the crystalline semiconductor particles 2.

The insulator layer 4 comprises an insulating material for separating the positive electrode from the negative electrode, and has translucency. In particular, materials that transmit 50% or more of light whose wavelength lies between 400 and 1200 nm that contributes to the generation of electricity are preferable. The insulating material may comprise, for example, glass slurry composed of components arbitrarily selected from among $SiO_2$, $Al_2O_3$, PbO, $B_2O_3$, ZnO, or a resin insulator such as polycarbonate.

The n-type semiconductor layer 5 is formed by the vapor-phase growth method, the thermal diffusion method or the like. For example, a vapor-phase phosphorous system compound that is a n-type impurity is added in a small amount to a vapor-phase silane compound. The n-type semiconductor layer 5 may be monocrystal, polycrystalline, microcrystalline or amorphous. The concentration of the microelement in the n-type semiconductor layer 5 may be, for instance, in the range of $1 \times 10^{16} - 1 \times 10^{22}$ atm/cm$^3$. The n-type semiconductor layer 5 may also serve as upper electrode.

Meanwhile, it is also possible to form a transparent upper electrode 7 formed of tin oxide, zinc oxide or the like between the n-type semiconductor layer 5 and the protective film 6 as shown in FIG. 2.

The protective film 6 preferably has the characteristics of a transparent dielectric. The material for the protective film 6 may be composed of, for example, one or a plurality of materials selected from among silicon oxide, cesium oxide, aluminum oxide, silicon nitride, titanium oxide, $SiO_2$—$TiO_2$, tantalum oxide, and yttrium oxide. It is formed by the CVD method, the PVD method or the like into a single layer or a combined layer on the n-type semiconductor layer 5. It is more desirable to give it the effect of antireflection by controlling the thickness thereof for that purpose.

Moreover, in order to decrease the resistance, it is also possible to provide an auxiliary electrode composed of fingers and bus bars formed in an arbitral pattern by screen-printing or an evaporation method.

Example 1-1

An example of the photoelectric conversion device according to this invention is hereinafter described.

Aluminum was used to form a lower electrode 1, and the surface thereof was roughened by sandblasting. Glass paste was used to form a 400 μm thick insulator layer 4 on the lower electrode 1. The glass used for the glass paste was a zinc oxide-based glass having a softening point of 550° C., and had an average transmittance of 94% for light at wavelengths of 400–1200 nm. Then, p-type silicon particle 2 with an average diameter of 900 μm were mounted on the insulator layer 4. Pressure was applied from above the p-type silicon particles 2 so as to deform the surface of the insulator layer 4 and bring them into contact with the lower electrode 1. Then, heat was applied so as to fire the glass paste. Subsequently, a 200 nm thick n-type silicon layer 5 serving also as an upper electrode was formed over the silicon particles 2 and the insulator layer 4. The n-type silicon layer 5 serving also as upper electrode had an average transmittance of 85% for light at wavelengths of 400–1200 nm. A protective film 6 made of silicon nitride was further formed with a thickness of 100 nm.

Evaluation of the arithmetic average roughness was carried out according to JIS.

Evaluation of adhesiveness was carried out after exposing samples to a 85° C., 95% RH environment for 500 hours, by observing the presence/absence of peeling between the lower electrode 1 and the insulator layer 4. Samples that had no peeling observed were marked by ○, samples that had peeling in a limited area were marked by Δ, and samples that suffered significant peeling were marked by X.

The "arithmetic average roughness" of the roughened surface was varied as shown in examples 1–5, and the adhesiveness and the photoelectric conversion efficiency were evaluated on each sample, the result of which is shown in Table 1. At the same time, evaluation was carried out on comparative examples 1–3 using a photoelectric conversion device which was not subjected to the surface roughening treatment (See FIG. 3). The arithmetic average roughnesses of comparative examples 1–3 were 0.002, 0.005, and 30, respectively.

TABLE 1

|  | Arithmetic average roughness | Adhesiveness | Conversion efficiency (%) |
| --- | --- | --- | --- |
| Example 1 | 0.01 | ○ | 8.7 |
| Example 2 | 0.1 | ○ | 9.3 |
| Example 3 | 1 | ○ | 9.6 |
| Example 4 | 5 | ○ | 9.7 |
| Example 5 | 10 | ○ | 9.8 |
| Comparative example 1 | 0.002 | X | 7.2 |
| Comparative example 2 | 0.005 | Δ | 7.3 |
| Comparative example 3 | 30 | ○ | —(Short circuit) |

As is apparent from the above result, examples 1–5 with the surface of the lower electrode 1 being roughened to an appropriate extent exhibited high photoelectric conversion efficiencies. Preferably, the arithmetic average roughness is in the range of 0.01–10. When the arithmetic average roughness is below 0.01, the effect of improving the photoelectric conversion efficiency is too small and the adhesiveness is poor. Such roughnesses are therefore unfavorable. When the arithmetic average roughness is above 10, the insulator on the surface of the lower electrode 1 becomes partially thin causing short circuit upon application of voltage. Such roughnesses are therefore also unfavorable. More desirably, the arithmetic average roughness is in the range of 0.1–10.

Subsequently, the transmittance of the insulating layer was varied and the photoelectric conversion efficiency was evaluated on each case, the result of which is shown in Table 2. Each of the transmittances shown in Table 2 represents the average transmittance of the insulator for light at wavelengths of 400–1200 nm. The arithmetic average roughness of the surface of the lower electrode 1 was 1.

TABLE 2

| | Average transmittance of insulator layer (%) | Conversion efficiency (%) |
|---|---|---|
| Example 6 | 95 | 10.5 |
| Example 7 | 70 | 9.2 |
| Example 8 | 50 | 8.5 |
| Comparative example 4 | 30 | 6.4 |
| Comparative example 5 | 10 | 4.7 |

The above result indicates that preferred average transmittances of the insulator layer are 50% or more (examples 6–8). Since the photoelectric conversion efficiency drops at the average transmittances below 50% (comparative examples 4 and 5), such transmittances are unfavorable.

Also, the material of the lower electrode 1 was varied and the photoelectric conversion efficiency was evaluated in each case, the result of which is shown in Table 3. The arithmetic average roughness of the surface of the lower electrode 1 was 1, and the average transmittance of the insulator layer was 95%.

TABLE 3

| | Material of lower electrode | Conversion efficiency (%) |
|---|---|---|
| Example 9 | Aluminum | 10.5 |
| Example 10 | 80% aluminum +20% titanium | 10.4 |
| Example 11 | 90% aluminum + 5% silicon | 10.2 |
| Comparative example 6 | Nickel | 8.4 |
| Comparative example 7 | Iron | 7.9 |
| Comparative example 8 | Tin | 7.6 |

As is apparent from the above result, preferred materials for the lower electrode 1 are aluminum and aluminum alloys (examples 9–11). Materials other than aluminum and aluminum alloys are unfavorable because of the low photoelectric conversion efficiencies (comparative examples 6–8).

Example 1-2

The lower electrode 1 was made by using an aluminum-manganese alloy, and its surface was roughened by etching with chemical solution. An insulator layer 4 was formed on the lower electrode 1. Glass paste was used for forming the insulator layer 4 with a thickness of 150 $\mu$m on the lower electrode 1. The glass used for the glass paste was a boron oxide-based glass having a softening point of 500° C., and its average light transmittance for light at wavelengths of 400–1200 nm was 94%. P-type silicon crystal particles 2 whose average particle diameter was 400 $\mu$m were deposited on the insulator layer 4. Then, heat was applied in order to fire the glass paste. A n-type silicon layer 5 was then formed with a thickness of 50 nm over the p-type silicon crystal particles 2 and the insulator layer 4. A 200 nm thick upper electrode 7 made of tin oxide was further formed on the n-type silicon layer 5, in which the average light transmittance of the upper electrode 7 was 76% for light at wavelengths of 400–1200 nm. A 100 nm thick protective film 6 made of silicon nitride was formed thereon.

The arithmetic average roughness was varied and the photoelectric conversion efficiency was evaluated in each case, the result of which is shown in Table 4.

TABLE 4

| | Arithmetic average roughness | Adhesiveness | Conversion efficiency (%) |
|---|---|---|---|
| Example 12 | 0.01 | ○ | 8.5 |
| Example 13 | 0.1 | ○ | 9.1 |
| Example 14 | 1 | ○ | 9.2 |
| Example 15 | 5 | ○ | 9.2 |
| Example 16 | 10 | ○ | 8.3 |
| Comparative example 9 | 0.002 | x | 6.8 |
| Comparative example 10 | 0.005 | Δ | 6.9 |
| Comparative example 11 | 30 | ○ | −(Short circuit) |

It is apparent from the result above that the photoelectric conversion efficiency is high when the surface of the lower electrode 1 is roughened to an appropriate extent (examples 12–16). Preferred arithmetic average roughnesses are in the range of 0.01–10. In the cases of the arithmetic average roughnesses below 0.01, the effect of improving the photoelectric conversion efficiency is too small and the obtained adhesivenesses are poor. Such small roughnesses are therefore unfavorable. When the arithmetic average roughness is over 10, the insulator layer on the surface of the lower electrode 1 partially becomes thin resulting in short circuit upon application of voltage. Therefore, such a roughness is also unfavorable. More desirably, the arithmetic average roughness is in the range of 0.1–10.

Subsequently, the transmittance of the upper electrode was varied and the photoelectric conversion efficiency was evaluated in each case, the result of which is shown in Table 5. Each of the transmittances shown in Table 5 represents the average transmittance for light at wavelengths of 400–1200 nm. The arithmetic average roughness of the surface of the lower electrode 1 was 0.5.

TABLE 5

| | Average transmittance of upper electrode (%) | Conversion efficiency (%) |
|---|---|---|
| Example 17 | 95 | 10.2 |
| Example 18 | 70 | 9.3 |
| Example 19 | 50 | 7.6 |
| Comparative example 12 | 35 | 4.2 |
| Comparative example 13 | 20 | 3.7 |

The result indicates that preferred average transmittances of the upper electrode are 50% or more. When the light transmittance of the upper electrode was below 50%, the photoelectric conversion efficiency largely dropped, which means that such rates are unfavorable.

2. Second Embodiment

Figure 5:
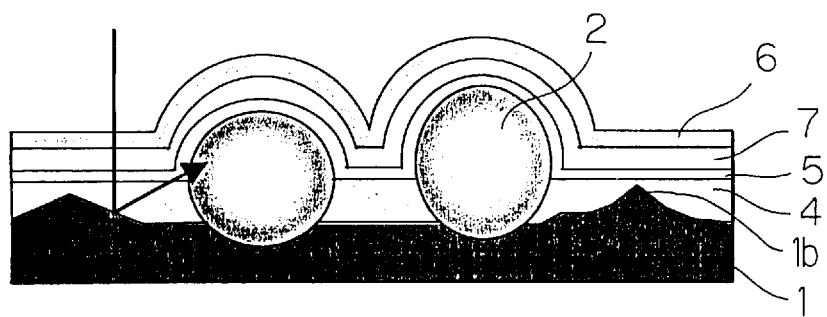
FIG. 5 is a cross-sectional view of another photoelectric conversion device according to the second embodiment of the present invention.

FIGS. 4 and 5 illustrate a second embodiment of the photoelectric conversion device according to the present invention. The numerals 1, 2, 1b, 4, 5, 6, and 7 denote a lower electrode, p-type crystalline semiconductor particles, a protruding portion formed on the surface of the lower electrode 1, a translucent insulator layer, a n-type semiconductor layer, a protective film, and a transparent upper electrode, respectively.

In FIGS. 4 and 5, the elements equivalent to those in FIGS. 1 and 2 are denoted by the same numerals. Explanation of the equivalent elements is therefore not repeated here.

The protruding portion 1b formed on the surface of the lower electrode 1 has an effect to direct light incident on areas where the crystalline semiconductor particles 2 are not present to the crystalline semiconductor particles 2. The light incident on the protruding portion 1b is reflected and directed to the crystalline semiconductor particles 2 so as to contribute to the generation of electricity so that high photoelectric conversion efficiency can be realized. Intervals between the protruding portions 1b may be designed with or without a periodic pattern as shown in FIG. 4 and FIG. 5. There is no restriction requiring that a crystalline semiconductor particle 2 should be present between the protruding portions 1b.

The protruding portion 1b is preferably formed on the surface of the lower electrode 1, because the protruding portion 1b can have the highest possible height when formed on the surface of the lower electrode 1, so that a large quantity of light can be directed to the crystalline semiconductor particles 2.

The material constituting the protruding portion 1b may be the same as the material of the lower electrode 1 or may be a different one. The material constituting the protruding portion 1b is preferably aluminum, copper, nickel, iron, or an alloy thereof, or titanium nitride. More desirably, it should be an aluminum alloy or a copper alloy comprising mainly aluminum or copper, to which silver, gold, platinum, tin, manganese, chromium, titanium, iron, or silicon is added. This is because such materials exhibit high reflectance and are inexpensive.

When the protruding portions 1b is formed on the lower electrode 1, the height of the protruding portion 1b is preferably 1 μm or more and ½ of the average particle diameter of the crystalline semiconductor particles 2 or less. When the height of the peak of the protruding portion 1b is larger than ½ of the average diameter of the crystalline semiconductor particles 2, the insulator layer 4 needs to be formed thick in order to cover the protruding portion 1b. In such a case, problems that the pn-junction area is reduced and the formation of the upper electrode becomes hard may arise. When the height of the peak of the protruding portion 1b is less than 1 μm, the light collecting effect is lessened. Both of the above cases are therefore unfavorable.

In order to form the protruding portion 1b, there are several methods including: a method in which the protruding portion 1b is formed on the lower electrode 1 by press molding; a method in which the crystalline semiconductor particles 2 are pressed into the lower electrode 1 so that the lower electrode 1 being present among the crystalline semiconductor particles 2 is lifted up in a protruding manner; a method in which reflective metal particles that are smaller than the crystalline semiconductor particles 2 are dispersed and pressed so as to sink into the lower electrode 1, thereby forming the protruding portion 1b; a method in which paste of a reflective metal powder is subjected to printing and firing, thereby forming the protruding portion 1b; and methods in which the surface of the lower electrode 1 is formed as an irregular surface by sandblasting, the RIE method, or etching by means of chemical solution.

Figure 6:
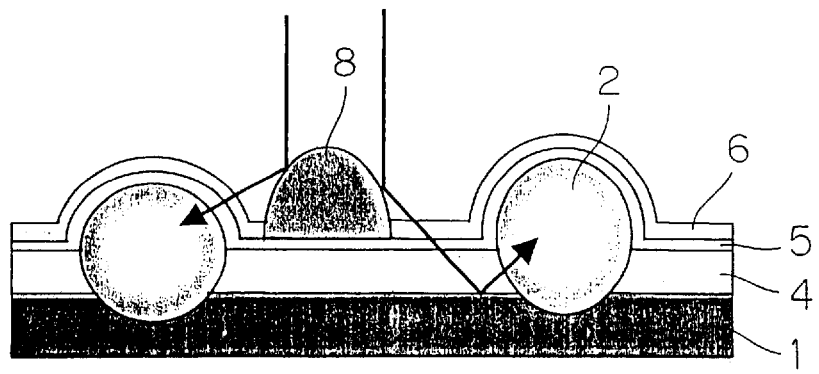
FIG. 6 is a cross-sectional view of still another photoelectric conversion device according to the second embodiment of the present invention.
Figure 12:
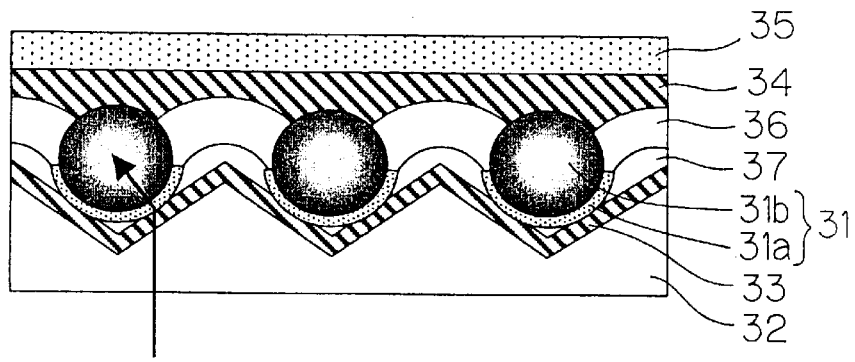
FIG. 12 is a sectional view of a conventional photoelectric conversion device.
Figure 13:
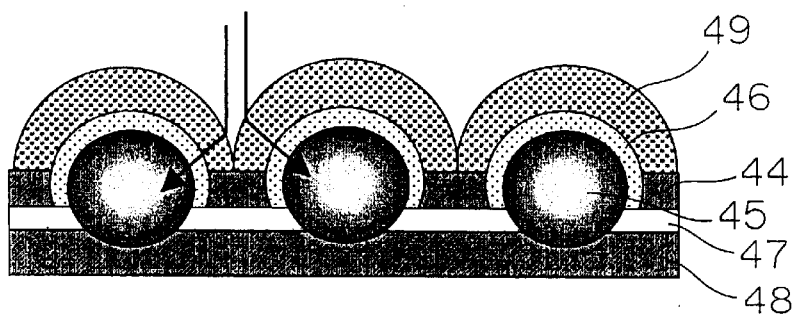
FIG. 13 is a sectional view of a conventional photoelectric conversion device.
Figure 14:
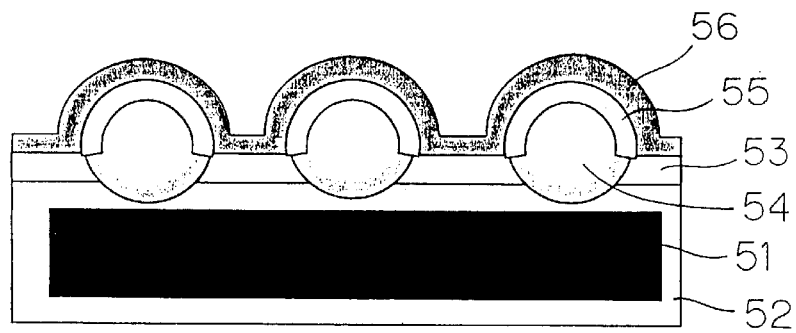
FIG. 14 is a sectional view of a conventional photoelectric conversion device.

Meanwhile, this protruding portion 1b may be formed in a surface portion of an upper auxiliary electrode. As shown in FIG. 6, when an auxiliary electrode 8 comprising a reflective material is formed into a protruding shape, light incident on the auxiliary electrode 8 can be directed to the crystalline semiconductor particles 2.

Example 2-1

Another example of the photoelectric conversion device according to the present invention is hereinafter discussed.

First, an insulator layer 4 was formed on a lower electrode 1. The lower electrode 1 was formed by using an aluminum-silicon alloy. Particles of the aluminum-silicon alloy were dispersed on the lower electrode 1 and pressed so as to sink into the lower electrode 1, by which protruding portions 1b were formed. Glass paste was used to form the insulator layer 4 of 500 μm in thickness on the substrate formed in the above manner. The glass used for the glass paste was a lead oxide-based glass having a softening point of 440° C. whose average light transmittance for light at wavelengths of 400–1200 nm was 90%. P-type silicon particles 2 with an average diameter of 800 μm were deposited on the insulator layer 4. While being vibrated, the p-type silicon particles 2 were moderately pressed so as to be disposed being in direct contact with the lower electrode 1 while avoiding contact with the previously disposed protruding portions 1b. Then, heating was carried out to fire the glass paste. Subsequently, a 300 nm thick n-type silicon layer 5 serving also as upper electrode was formed over the silicon particles 2 and the insulator layer 4. This n-type silicon layer 5 serving also as upper electrode had an average light transmittance of 92% for light at wavelengths of 400–1200 nm. A protective film 6 was further formed with a thickness of 200 nm by using silicon nitride.

Evaluation was carried out after the average height of the protruding portions 1b was varied, the result of which is shown in Table 6.

The "Height of protruding portion Silicon particle diameter" indicated in Table 6 refers to the ratio of the average height of the protruding portions 1b to the average diameter of the silicon particles 2. A comparative example 23 in which the protruding portions 1b were not formed as in FIG. 7 is also shown.

TABLE 6

|  | Height of protruding portion: Silicon particle diameter | Height of protruding portion (μm) | Conversion efficiency (%) |
| --- | --- | --- | --- |
| Example 21 | 1/2 | 400 | 10.3 |
| Example 22 | 1/10 | 80 | 10.3 |
| Example 23 | 1/20 | 40 | 10.1 |
| Example 24 | 1/100 | 8 | 9.6 |
| Example 25 | 1/800 | 1 | 9.0 |
| Comparative example 21 | 3/4 | 600 | ⁻(Short circuit) |
| Comparative example 22 | 1/2000 | 0.4 | 7.9 |
| Comparative example 23 | No protruding portion | 0 | 7.5 |

As is apparent from the above result, high photoelectric conversion efficiencies were obtained in examples 21–25 where the protruding portions 1b were formed with appropriate heights. The heights of the protruding portions 1b below 1 μm resulted in little effect in improving the photoelectric conversion efficiency, and are therefore unfavorable. Also, when the ratio of the average height of the protruding portions 1b to the average diameter of the silicon particles was over ½, the insulator layer 4 failed to cover the protruding portions 1b. As a result, a part of the protruding portions 1b stuck out from the insulator layer 4, resulting in short circuit due to contact between the upper electrode and the protruding portions 1b. Such ratios are therefore unfavorable. In addition, even if the insulator layer 4 has been thickened so as to prevent short circuit, the pn-junction area is reduced accordingly causing the photoelectric conversion efficiency to drop, which is also unfavorable.

Subsequently, the transmittance of the insulator layer 4 was varied and the photoelectric conversion efficiency was evaluated on each sample, the result of which is shown in Table 7. Each of the light transmittances shown in Table 7 represents the average transmittance of the insulator layer 4 for light at wavelengths of 400–1200 nm. The ratio of the height of the protruding portion 1b to the silicon particle diameter was 1/10 (80 μm).

TABLE 7

|  | Average transmittance of insulator layer (%) | Conversion efficiency (%) |
| --- | --- | --- |
| Example 26 | 95 | 11.6 |
| Example 27 | 70 | 9.5 |
| Example 28 | 50 | 9.0 |
| Comparative example 24 | 30 | 7.0 |
| Comparative example 25 | 10 | 6.3 |

The above result indicates that preferred average light transmittances of the insulator layer 4 are 50% or more. The average transmittances below 50% are unfavorable because the photoelectric conversion efficiency drops at those rates.

Subsequently, the material for forming the protruding portions 1b was varied and the reflectance of the material of the protruding portions and the photoelectric conversion efficiency were evaluated on each sample. The result of the evaluation is shown in Table 8. The ratio of the height of the protruding portion 1b to the silicon particle diameter was 1/10, and the average transmittance of the insulator layer 4 was 95%.

TABLE 8

|  | Material of protruding portion | Reflectance (%) | Conversion efficiency (%) |
| --- | --- | --- | --- |
| Example 29 | Aluminum | 85 | 11.9 |
| Example 30 | 70% aluminum + 30% silver | 80 | 11.4 |
| Example 31 | 90% aluminum + 10% silicon | 82 | 11.5 |
| Example 32 | Copper | 84 | 11.8 |
| Example 33 | Nickel | 55 | 9.4 |
| Example 34 | Iron | 53 | 9.5 |
| Example 35 | Titanium nitride | 60 | 9.7 |
| Comparative example 28 | ITO | 10 | 7.9 |
| Comparative example 29 | Carbon | 3 | 7.6 |
| Comparative example 30 | Alumina | 6 | 7.8 |

The above result indicates that preferred materials for the protruding portions 1b are aluminum, aluminum-silver alloy, aluminum-silicon alloy, copper, nickel, iron, and titanium nitride. Materials other than aluminum, aluminum-silver alloy, aluminum-silicon alloy, copper, nickel, iron, and titanium nitride are unfavorable for the protruding portions 1b, because the photoelectric conversion efficiency dropped when such materials were used. In addition, the reflectance of the material of the protruding portions 1b is preferably 50% or more. Materials with reflectance below 50% are unfavorable, because with such materials, the samples had low photoelectric conversion efficiencies.

Example 2-2

Aluminum was used for the lower electrode 1, and protruding portions 1b were formed by press molding on the surface of the lower electrode 1. An insulator layer 4 was formed on the lower electrode 1 formed with the protruding portions 1b. The insulator layer 4 was formed 200 μm on the lower electrode 1 by using grass paste. The glass used for the glass paste was a bismuth oxide-based glass having a softening point of 510° C. and an average transmittance of 85% for light at wavelengths of 400–1200 nm. Then, p-type silicon particles 2 with an average diameter of 500 μm were deposited on the insulator layer 4. Heat was applied so as to fire the glass paste. Subsequently, a 100 nm thick n-type silicon layer 5 was formed over the p-type silicon particles 2 and the insulator layer 4, and an upper electrode 7 made of tin oxide was further formed with a thickness of 100 μm. The average transmittance of the upper electrode 7 for light at wavelengths of 400–1200 nm was 83%. Finally, a protective film 6 was formed by using silicon nitride with a thickness of 300 nm.

The average height of the protruding portions 1b was varied and the photoelectric conversion efficiency was evaluated on each sample, the result of which is shown in Table 9.

TABLE 9

|  | Height of protruding portion: Silicon particle diameter | Height of protruding portion (μm) | Conversion efficiency (%) |
| --- | --- | --- | --- |
| Example 36 | 1/2 | 250 | 9.8 |
| Example 37 | 1/10 | 50 | 9.7 |
| Example 38 | 1/20 | 25 | 9.5 |
| Example 39 | 1/100 | 5 | 9.1 |
| Example 40 | 1/500 | 1 | 8.9 |
| Comparative example 31 | 3/5 | 300 | ⁻(Short circuit) |
| Comparative example 32 | 1/2000 | 0.25 | 7.5 |
| Comparative example 33 | No protruding portion | 0 | 7.2 |

As is apparent from the above result, high photoelectric conversion efficiencies were obtained in examples 36–40 where the protruding portions 1b had appropriate heights.

The heights of the protruding portions 1b below 1 μm are unfavorable because at those heights, the protruding portions had little effect in improving the photoelectric conversion efficiency. When the ratio of the height of the protruding portion 1b to the silicon particle diameter was over ½, the insulator layer 4 failed to cover the protruding portions 1b. As a result, a part of the protruding portions 1b stuck out from the insulator layer 4, resulting in short circuit due to contact between the upper electrode and the protruding portions 1b. Such ratios are therefore unfavorable. In addition, even if the insulator layer 4 has been thickened so as to prevent short circuit, due to the pn-junction area that is reduced accordingly, the photoelectric conversion efficiency drops, which is also undesirable.

Subsequently, the transmittance of the upper electrode was varied and the photoelectric conversion efficiency was evaluated in each case, the result of which is shown in Table 10. Each of the light transmittances indicated in Table 10 represents the average transmittance of the upper electrode for light at wavelengths of 400–1200 nm. The ratio of the height of the protruding portion 1b to the silicon particle diameter was ⅕ (100 μm).

TABLE 10

|  | Average transmittance of upper electrode (%) | Conversion efficiency (%) |
| --- | --- | --- |
| Example 41 | 95 | 10.6 |
| Example 42 | 70 | 8.7 |
| Example 43 | 50 | 7.6 |
| Comparative example 34 | 35 | 4.0 |
| Comparative example 35 | 20 | 3.3 |

The result indicates that preferred average transmittances of the upper electrode are 50% or more. At the average transmittances below 50%, the photoelectric conversion efficiency sharply dropped. Such transmittances are therefore unfavorable.

3. Third Embodiment

FIGS. 8 and 9 are views showing a third embodiment of the photoelectric conversion device according to this invention. The numerals 1, 2, and 4 denote a lower electrode, p-type crystalline semiconductor particles, and a translucent insulator layer comprising an insulating material, respectively. The numeral 4a, 5, and 6 denote a protruding portion with roundness having the insulating material being swollen therein, a n-type semiconductor layer, and a protective film, respectively.

The elements in FIGS. 8 and 9 that are equivalent to the elements in FIG. 1 are denoted by the same numerals. Explanation of such equivalent elements is not repeated here.

FIG. 10 is a plan view showing an arrangement of the crystalline semiconductor particles 2. In FIG. 10, a straight line Z—Z is drawn connecting central parts of crystalline semiconductor particles 2. It is assumed that a straight line X—X crosses at right angles the line Z—Z approximately at the midpoint between central parts of a crystalline semiconductor particle 21 and a crystalline semiconductor particle 22 that are adjacent to each other. The arrangement is made such that other crystalline semiconductor particles 23 and 24 are disposed on the substrate 1 so as to be located on the straight line X—X. Disposing the crystalline semiconductor particles 21, 22, 23, 24, and so forth in such a manner forms a hexagonal or honeycomb arrangement.

The insulating material swells among the crystalline semiconductor particles to form the protruding portions 4a having a saddle-like shape. A horizontal section (X—X cross section) of this protruding portion 4a has a protruding configuration with roundness as shown in FIG. 8. A longitudinal section (Y—Y cross section) of this protruding portion 4a has a continuous surface with almost even height.

Now, how to make the protruding portion 4a is described. First, a box-shaped jig is provided with holes that are smaller than the crystalline semiconductor particles 2 and arranged in a hexagonal or honeycomb configuration. The pressure inside the box-shaped jig is then decreased by a pump so that the crystalline semiconductor particles 2 are sucked into the holes. After the jig has been transferred onto the substrate 1, the pressure inside the jig is increased so as to dispose the crystalline semiconductor particles 2 on the substrate 1. Then, the insulator layer 4 is formed among the crystalline semiconductor particles 2. At this stage, the viscosity of the insulator layer 4 is reduced by means of heat or the like so that the surface tension is utilized to form a saddle-shaped protruding portion 4a between the crystalline semiconductor particles 2 that are most closely adjacent to each other.

The roundish protruding portions 4a have an effect to direct light incident on areas where the crystalline semiconductor particles 2 are absent to the crystalline semiconductor particles 2 that are present nearby. As shown in FIG. 8, the light that has been incident on the protruding portion 4a is reflected and refracted by the protruding portion 4a, and directed to enter the crystalline semiconductor particles 2 located opposite to each other so that the light is enabled to contribute to the generation of electricity. Accordingly, the device can achieve high photoelectric conversion efficiency.

Example 3-1

Another example of the present invention is now described.

First, an insulator layer 3 was formed on an aluminum substrate 1. The substrate 1 also serves as lower electrode. Glass paste was used for forming the insulator layer 3 with a thickness of 50 $\mu$m on the substrate 1. The glass for the grass paste had a softening point of 440° C. Then, p-type silicon particles 2 with an average diameter of 800 $\mu$m were disposed in a hexagonal arrangement as shown in FIG. 10. In order to arrange the p-type silicon particles in the above-mentioned manner, a vacuum suction method using a box-shaped jig was adopted. Subsequently, heating was carried out so as to fire the glass paste. As a result, roundish, protruding portions were formed in the form of saddle among the silicon particles. The p-type silicon particles 2 were disposed such that a pair of silicon particles are located at positions in the skirts of a protruding portion that are opposed to each other with the protruding portion in between. Subsequently, a 200 nm thick n-type silicon layer 4 was formed over the p-type silicon particles 2 and the insulator layer 3. A protective film 5 with a thickness of 500 nm was further formed by using silicon nitride.

The height of the roundish protruding portions was varied by controlling the peak temperature of heat applied for firing the glass paste so as to regulate the viscosity of the glass at the time of firing. The dependence of the photoelectric conversion efficiency on the ratio of the height of the protruding portion (the length between the surface of the insulator layer excluding the protruding portion and the peak of the protruding portion) to the silicon particle diameter is shown in Table 11.

TABLE 11

|  | Height of protruding portion: Silicon particle diameter (%) | Conversion efficiency (%) |
| --- | --- | --- |
| Example 51 | 50 | 11.0 |
| Example 52 | 40 | 10.9 |
| Example 53 | 30 | 10.8 |
| Example 54 | 20 | 10.6 |
| Example 55 | 10 | 10.3 |
| Example 56 | 5 | 10.1 |
| Comparative example 51 | 2 | 8.8 |
| comparative example 52 | 0 | 8.5 |

The result shows that the larger the height of the roundish protruding portion is, the better the photoelectric conversion efficiency becomes. More desirably, the ratio of the height of the protruding portion to the silicon particle diameter is 5% or more (examples 51–56).

Subsequently, the silicon particles were arranged in a square configuration as shown in FIG. 11, and the height of the protruding portion 4a was varied. The result of evaluation is shown in Table 12. It should be noted that because of the square arrangement of the silicon particles as in FIG. 11, there are no silicon particles located at positions in the skirts of the protruding portions that are opposed to each other.

TABLE 12

| | Height of protruding portion: Silicon particle diameter (%) | Conversion efficiency (%) |
|---|---|---|
| Comparative example 53 | 50 | 8.4 |
| Comparative example 54 | 40 | 8.4 |
| Comparative example 55 | 30 | 8.3 |
| Comparative example 56 | 20 | 8.3 |
| Comparative example 57 | 10 | 8.3 |
| Comparative example 58 | 5 | 8.2 |
| Comparative example 59 | 2 | 8.1 |
| Comparative example 60 | 0 | 8.0 |

As is apparent from the above result, little improvement in photoelectric conversion efficiency was observed in this example. According to the results discussed so far, it is preferable that the silicon particles are located at positions opposed to each other with the protruding portion in between.

What is claimed is:

1. A photoelectric conversion device comprising:
   a lower electrode;
   numerous crystalline semiconductor particles of one conductivity type deposited on the lower electrode;
   an insulator formed among the crystalline semiconductor particles; and a semiconductor layer of the opposite conductivity type formed on the side of the upper portions of the crystalline semiconductor particles,
   wherein the insulator is formed of a translucent material, and the surface of the lower electrode comprises a roughened surface,
   wherein the arithmetic average roughness of the surface of the lower electrode is in the range of 0.01–10.

2. The photoelectric conversion device according to claim 1, wherein the lower electrode is made of aluminum or an aluminum alloy.

3. A photoelectric conversion device comprising:
   a lower electrode;
   numerous crystalline semiconductor particles of one conductivity type deposited on the lower electrode;
   an insulator formed among the crystalline semiconductor particles; and
   a semiconductor layer of the opposite conductivity type formed on the side of the upper portions of the crystalline semiconductor particles,
   wherein the insulator is formed of a translucent material, and a protruding portion comprising a reflective material is formed between the crystalline semiconductor particles, an upper surface of the protruding portion being non-planar.

4. The photoelectric conversion device according to claim 3, wherein the protruding portion is formed in a part of the surface of the lower electrode.

5. The photoelectric conversion device according to claim 4, wherein the height of the protruding portion is 1 μm or more and ½ of the average diameter of the crystalline semiconductor particles or less.

6. The photoelectric conversion device according to claim 3, wherein an upper electrode is formed on the semiconductor layer of the opposite conductivity type, and the protruding portion is formed in a surface portion of the upper electrode.

7. The photoelectric conversion device according to claim 3, wherein the reflective material constituting the protruding portion is composed of one or a plurality of materials selected from the group consisting of aluminum, copper, nickel, iron, an alloy thereof, and titanium nitride.

8. A photoelectric conversion device comprising:
   a lower electrode;
   numerous crystalline semiconductor particles of one conductivity type deposited on the lower electrode;
   an insulator formed among the crystalline semiconductor particles; and
   a semiconductor layer of the opposite conductivity type formed on the side of the upper portions of the crystalline semiconductor particles,
   wherein the crystalline semiconductor particles are arranged such that a crystalline semiconductor particle is located on a straight line that perpendicularly crosses a line segment connecting central parts of other crystalline semiconductor particles that are adjacent to each other approximately at the midpoint of the line segment, and
   wherein an insulating material of the insulator forms a saddle-shaped protruding portion between the crystalline semiconductor particles that are adjacent to each other.

9. The photoelectric conversion device according to claim 8, wherein the crystalline semiconductor particles are arranged to form a hexagonal configuration.

10. The photoelectric conversion device according to claim 8, wherein the crystalline semiconductor particles are arranged to form a honeycomb configuration.

* * * * *